United States Patent
Tu et al.

(10) Patent No.: US 8,513,696 B2
(45) Date of Patent: Aug. 20, 2013

(54) LATERAL THERMAL DISSIPATION LED AND FABRICATION METHOD THEREOF

(75) Inventors: Po Min Tu, Chiayi County (TW); Shih Cheng Huang, Hsinchu (TW); Ying Chao Yeh, Taipei County (TW); Wen Yu Lin, Taichung County (TW); Peng Yi Wu, Taichung (TW); Shih Hsiung Chan, Hsinchu County (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 435 days.

(21) Appl. No.: 12/717,788

(22) Filed: Mar. 4, 2010

(65) Prior Publication Data

US 2010/0224858 A1    Sep. 9, 2010

(30) Foreign Application Priority Data

Mar. 6, 2009  (TW) ............................... 98107250 A

(51) Int. Cl.
| | |
|---|---|
| H01L 29/06 | (2006.01) |
| H01L 31/00 | (2006.01) |
| H01L 33/00 | (2010.01) |
| H01L 23/28 | (2006.01) |

(52) U.S. Cl.
USPC ......... 257/99; 257/14; 257/796; 257/E33.075

(58) Field of Classification Search
USPC ............... 257/13, 14, 99, 276, 625, 675, 706, 257/717, 718, 720, 796, E33.075, E31.131, 257/E23.051, E23.101, E23.103; 438/47
See application file for complete search history.

(56) References Cited

U.S. PATENT DOCUMENTS

| | | | |
|---|---|---|---|
| 5,563,422 A | 10/1996 | Nakamura et al. | |
| 5,739,554 A | 4/1998 | Edmond et al. | |
| 6,614,172 B2 | 9/2003 | Chiu et al. | |
| 6,818,531 B1 | 11/2004 | Yoo et al. | |
| 7,525,248 B1* | 4/2009 | Fan ............................ | 313/512 |
| 2005/0023550 A1* | 2/2005 | Eliashevich et al. ............ | 257/99 |
| 2005/0093004 A1* | 5/2005 | Yoo ................................. | 257/79 |
| 2006/0073692 A1* | 4/2006 | Yoshida et al. ............... | 438/605 |
| 2006/0169990 A1* | 8/2006 | Taki et al. ....................... | 257/79 |
| 2007/0231963 A1* | 10/2007 | Doan et al. .................... | 438/107 |
| 2008/0121903 A1* | 5/2008 | Hiramatsu et al. .............. | 257/89 |
| 2008/0142824 A1 | 6/2008 | Chen et al. | |
| 2008/0293177 A1* | 11/2008 | Kim et al. ....................... | 438/39 |

(Continued)

FOREIGN PATENT DOCUMENTS

| | | | |
|---|---|---|---|
| CN | 1265228 A | | 8/2000 |
| CN | 1344035 A | | 4/2002 |
| JP | 2002094116 A | * | 3/2002 |
| TW | 200828642 A | | 7/2008 |

OTHER PUBLICATIONS

English Machine Translation of Rin_et_al (JP 2002094116 A).*
"Enhanced thermal dissipation and light output of GaN/Sapphire light-emitting diode by direct Cu electroplating," Conference Paper National Chung Hsing University.

(Continued)

*Primary Examiner* — Daniel Luke
*Assistant Examiner* — Khaja Ahmad
(74) *Attorney, Agent, or Firm* — Altis Law Group, Inc.

(57) ABSTRACT

A lateral thermal dissipation LED and a fabrication method thereof are provided. The lateral thermal dissipation LED utilizes a patterned metal layer and a lateral heat spreading layer to transfer heat out of the LED. The thermal dissipation efficiency of the LED is increased, and the lighting emitting efficiency is accordingly improved.

9 Claims, 13 Drawing Sheets

(56) References Cited

U.S. PATENT DOCUMENTS

| | | | |
|---|---|---|---|
| 2009/0068774 A1* | 3/2009 | Slater et al. | 438/26 |
| 2009/0122514 A1* | 5/2009 | Yoon et al. | 362/84 |
| 2009/0272993 A1* | 11/2009 | Cheong | 257/94 |
| 2009/0272994 A1* | 11/2009 | Lim | 257/97 |

OTHER PUBLICATIONS

"Improved thermal management of GaN/Sapphire light-emitting diodes embedded in reflective heat spreaders," Applied Physics letters 93, 11907 (2008).

* cited by examiner

LATERAL THERMAL DISSIPATION LED AND FABRICATION METHOD THEREOF

BACKGROUND OF THE INVENTION

1. Field of the Invention

The present invention relates to a light emitting diode (LED), and relates more particularly to a lateral thermal dissipation LED.

2. Description of the Related Art

LEDs are currently used in increasing numbers of applications because of the features of long life, low power consumption and high reliability. The input power is increased by raising the operation current density of the LED in order to improve its brightness. As the operation current density of the LED is raised, the junction temperature is increased accordingly. Consequently, the energy band structure of the LED is changed, and the package structure or the phosphor powders in the package structure deteriorate, causing reduced brightness or performance. To improve the brightness, the thermal dissipation performance needs to be upgraded. In order to resolve the problem of high heat generated from a high power LED, many prior arts and previous studies have focuses on the significant issue of thermal dissipation.

In LED structures of the prior arts, the efficacy of the thermal dissipation is not satisfactory. For example, U.S. Pat. No. 5,563,422 puts forth that an LED die has no particular structures or apparatuses with a thermal dissipation function to assist in the heat reduction of the LED die. Accordingly, the light efficiency is generally limited.

Some of the prior arts utilize a modified electrode structure to improve the thermal dissipation of an LED die so as to resolve the problem of poor thermal dissipation. U.S. Pat. No. 6,614,172 utilizes flip chip bonding and a die with rough surface to increase the light emitting efficiency of an LED. Furthermore, electrodes with a metal structure are also used to improve thermal conduction so as to enable the LED to further have a thermal dissipation function. However, such a prior art has the problem that the electrical conduction and the thermal conduction share the same path. That is, the electrical conduction and the thermal conduction have an adverse influence on each other. Furthermore, the manufacturing yield of the aforesaid prior art is limited such that the production cost of the LED is increased.

Some of the prior arts improve the lighting efficiency of an LED by resolving the problem of poor thermal dissipation. U.S. Pat. No. 6,818,531 utilizes a laser lift-off (LLO) method to remove an LED from an original epitaxial substrate, and bonds the LED onto another substrate with good thermal conductivity so as to increase the efficiency of thermal dissipation. However, as such prior art replaces the original substrate of the LED with a thermally conductive substrate to improve the light efficiency of the LED, it needs expensive manufacturing equipment and has the disadvantages of low manufacturing yields and low productivity per unit area.

Some of the prior arts utilize a vertical type LED structure to further have the function of thermal dissipation. U.S. Pat. No. 5,739,554 also utilizes a vertical type LED structure and an N type SiC substrate to accelerate thermal dissipation. However, the cost of the N type SiC substrate is too high, its mechanical processing is poor, and its crystal quality is inferior to the crystal quality of an $Al_2O_3$ substrate. Furthermore, the SiC substrate can absorb UV light of wavelengths below 380 nm so it is not suitable to serve as a substrate carrying an LED emitting UV light with wavelengths below 380 nm.

Some of the prior arts utilize copper to cover the lateral structure of an LED for resolving the problem of poor thermal dissipation. A similar technique is disclosed by "Enhanced thermal dissipation and light output of GaN/Sapphire light-emitting diode by direct Cu electroplating," Conference Paper National Chung Hsing University. The prior art employs copper with good thermal conductivity as the cover of the lateral structure of an LED to act as the thermal conducting interface of the LED. However, the areas of lateral side of the LED for thermal dissipation are small so the thermal dissipation effect is limited. In addition, such a structure has the aforesaid advantage of thermal dissipation only when an extra current is applied to the LED.

Some of the prior arts utilize copper to cover the lateral structure of an LED and its substrate for resolving the problem of poor thermal dissipation. A similar technique is disclosed by "Improved thermal management of GaN/Sapphire light-emitting diodes embedded in reflective heat spreaders," Applied Physics letters 93, 11907 (2008). The prior art employs copper with good thermal conductivity to cover the substrate and the lateral structure of an LED to increase the area of thermal dissipation. The copper cover is on the substrate, however, and heat generated from the interface cannot be directly dissipated. Furthermore, the copper just covering the lateral has small dissipation areas so the thermal dissipation effect is limited.

In view of the foregoing prior arts, only the LLO technology can resolve the problem of poor thermal dissipation of the LED structure, but the other prior arts have inferior thermal conduction or are ineffective in thermal dissipation. The LLO technology has the disadvantages of high costs, low yields, and low productivity for mass production. Therefore, a new technology needs to be developed to resolve the problem of thermal dissipation of LEDs. The present invention puts forth a lateral thermal dissipation LED and a method for manufacturing such an LED. In contrast with LLO technology, the present invention has a low manufacturing cost, and can effectively resolve the problem of thermal dissipation at the interface.

SUMMARY OF THE INVENTION

Considering the forgoing background, the objective of the present invention is to provide an LED with excellent thermal dissipation, in which heat is conducted to the outside from the lateral structure along with a proper packaging technology.

The present invention discloses a lateral thermal dissipation LED comprising a substrate, an N type conductive semiconductor layer, a light emitting layer, a P type conductive semiconductor layer and a heat spreading layer. A buffer layer is interposed between the substrate and the N type conductive semiconductor layer. An undoped semiconductor layer is interposed between the buffer and the N type conductive semiconductor layer. The light emitting layer is sandwiched between the N type conductive semiconductor layer and the P type conductive semiconductor layer. A metal layer with a pattern is further formed between the undoped semiconductor layer and the N type conductive semiconductor layer. The pattern of the metal layer includes a plurality of vias, and the metal layer with the pattern and the N type conductive semiconductor layer have ohmic contact. In view of the aforesaid structure, portions of the P type conductive semiconductor layer, the light emitting layer, and the N type conductive semiconductor layer are removed to expose a portion of N type conductive semiconductor layer. A P electrode is disposed on the P type conductive semiconductor layer. An N electrode is disposed on the exposed portion of the N type conductive semiconductor layer or on the metal layer with the pattern. Furthermore, a protecting layer covers the N type conductive semiconductor layer and the P type conductive semiconductor layer, but does not cover the N type electrode and the P type electrode. The heat spreading layer connects the metal layer with the pattern or the N type conductive semiconductor layer to a package substrate.

The present invention further discloses a method for manufacturing a lateral thermal dissipation LED. The method comprises the following steps of: providing a substrate; forming an N type conductive semiconductor layer on the substrate; forming a light emitting layer on the N type conductive semiconductor layer; forming a P type conductive semiconductor layer on the light emitting layer; and forming a heat spreading layer on the N type conductive semiconductor layer. In the foregoing steps, a step is further comprised as follows: forming a buffer layer between the substrate and the N type conductive semiconductor layer, and forming an undoped semiconductor layer between the buffer layer and the N type conductive semiconductor layer. In addition, a metal layer with a pattern is further formed between the undoped semiconductor layer and the N type conductive semiconductor layer, wherein the pattern of the metal layer includes a plurality of vias, and the metal layer with the pattern and the N type conductive semiconductor layer have ohmic contact. In view of the aforesaid structure, portions of the P type conductive semiconductor layer, the light emitting layer and the N type conductive semiconductor layer are removed to expose a portion of N type conductive semiconductor layer. A P electrode is disposed on the P type conductive semiconductor layer. An N electrode is disposed on the exposed portion of the N type conductive semiconductor layer or on the metal layer with the pattern. Furthermore, a protecting layer covers the N type conductive semiconductor layer and the P type conductive semiconductor layer, but does not cover the N electrode and the P electrode. The heat spreading layer connects the metal layer with the pattern or the N type conductive semiconductor layer to a package substrate.

The present invention discloses a lateral thermal dissipation LED in which the heat generated from the light emitting layer is transferred through the lateral of the LED to the outside by the metal layer with the pattern along with the packaging structure. Such an invention can solve the problem of the conventional LED with electrodes on the same side as that on which heat is dissipated through the epitaxial substrate with a low thermal conductivity.

In contrast with the LLO technology, the LED of the present invention can resolve the problem of the poor thermal dissipation without further increasing the manufacturing cost. Such an LED with high lighting efficiency is provided.

Another aspect of the present invention improves the lighting efficiency of an LED with electrodes at the same surface.

BRIEF DESCRIPTION OF THE DRAWINGS

The invention will be described according to the appended drawings in which.

DETAILED DESCRIPTION OF THE INVENTION

Figure 1A:
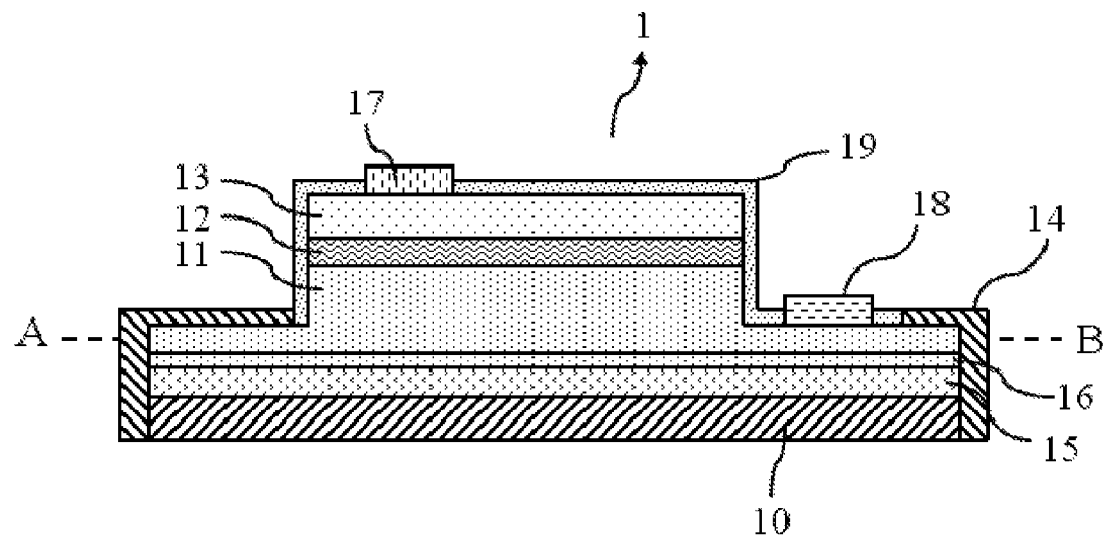
FIG. 1A is a cross-sectional view of a lateral thermal dissipation LED according to an embodiment of the present invention.

The present invention exemplarily demonstrates embodiments of a lateral thermal dissipation LED. In order to thoroughly understand the present invention, detailed descriptions of method steps and components are provided below. It should be noted that the implementations of the present invention are not limited to the specific details that are familiar to persons in the art related to semiconductor manufacturing processes, and such details are omitted to avoid unnecessary limitations to the present invention. On the other hand, components or method steps which are well known are not described in detail. A preferred embodiment of the present invention is described in detail below. However, in addition to the preferred detailed description, other embodiments can be broadly employed, and the scope of the present invention is not limited by any of the embodiments, but should be defined in accordance with the following claims and their equivalent.

The present invention provides a lateral thermal dissipation LED comprising a substrate, an N type conductive semiconductor layer, a light emitting layer, a P type conductive semiconductor layer and a heat spreading layer.

A buffer layer is interposed between the substrate and the N type conductive semiconductor layer. An undoped semiconductor layer is interposed between the buffer layer and the N type conductive semiconductor layer. The light emitting layer is sandwiched between the N type conductive semiconductor layer and the P type conductive semiconductor layer.

A metal layer with a pattern is further formed between the undoped semiconductor layer and the N type conductive semiconductor layer. The pattern of the metal layer includes a plurality of holes, and the metal layer with the pattern and the N type conductive semiconductor layer have ohmic contact resistance.

In view of the aforesaid structure, portions of the P type conductive semiconductor layer, the light emitting layer and the N type conductive semiconductor layer are removed to expose a portion of N type conductive semiconductor layer. A P type electrode is disposed on the P type conductive semiconductor layer. An N type electrode is disposed on the exposed portion of the N type conductive semiconductor layer or on the metal layer with the pattern. Furthermore, a protecting layer covers the N type conductive semiconductor layer and the P type conductive semiconductor layer, but does not cover the N type electrode and the P type electrode. The heat spreading layer connects the metal layer with the pattern or the N type conductive semiconductor layer and a package substrate.

The present invention further provides a method for manufacturing a lateral thermal dissipation LED comprising the steps of: providing a substrate; forming an N type conductive semiconductor layer on the substrate; forming a light emitting layer on the N type conductive semiconductor layer; forming a P type conductive semiconductor layer on the light emitting layer; and forming a heat spreading layer on the N type conductive semiconductor layer.

In addition to the aforesaid steps, a step is further comprised as follows: forming an undoped semiconductor layer between the buffer layer and the N type conductive semiconductor layer. In addition, a metal layer with a pattern is further formed between the undoped semiconductor and the N type conductive semiconductor layer, wherein the pattern of the metal layer includes a plurality of holes, and the metal layer with the pattern and the N type conductive semiconductor layer have ohmic contact.

In view of the aforesaid steps, portions of the P type conductive semiconductor layer, the light emitting layer and the N type conductive semiconductor layer are removed to expose a portion of N type conductive semiconductor layer. A P electrode is disposed on the P type conductive semiconductor layer. An N electrode is disposed on the exposed portion of the N type conductive semiconductor layer or on the metal layer with the pattern. Furthermore, a protecting layer covers the N type conductive semiconductor layer and the P type conductive semiconductor layer, but does not cover the N type electrode and the P type electrode. The heat spreading layer connects the metal layer with the pattern or the N type conductive semiconductor layer to a package substrate.

The above-mentioned substrate can be a sapphire ($Al_2O_3$) substrate, a silicon carbide (SiC) substrate, a lithium aluminate ($LiAlO_2$) substrate, a lithium gallates ($LiGaO_2$) substrate, a silicon substrate, a gallium nitride (GaN) substrate, a zinc oxide (ZnO) substrate, an aluminum zinc oxide (AlZnO) substrate, a gallium arsenide (GaAs) substrate, a gallium phosphide (GaP) substrate, a gallium antimonide (GaSb) substrate, an indium phosphide (InP) substrate, an indium arsenide (InAs) substrate, a zinc selenide (ZnSe) substrate or metal substrate.

The above-mentioned heat spreading layer is formed using solidified thermal dissipation adhesive after being cooled, and is made by mixing silver and epoxy.

The above-mentioned lateral thermal dissipation LED is a Group III-V nitride LED or a Group II-VI nitride LED. The light emitting layer is a single quantum well layer or a multiple quantum well layer. The N type conductive semiconductor layer, the light emitting layer, and the P type conductive semiconductor layer are formed by metal organic chemical vapor deposition (MOCVD).

The material of the above-mentioned buffer is aluminum nitride (AlN), aluminum gallium nitride (AlGaN), or arsenic gallium nitride/indium gallium nitride (AsGaN/InGaN). The material of the above-mentioned undoped semiconductor layer is gallium nitride (GaN). The above-mentioned buffer layer and undoped semiconductor layer are formed by MOCVD.

Portions of the P type conductive semiconductor layer, the light emitting layer, and the N type conductive semiconductor layer are removed so as to expose a portion of the N type conductive semiconductor layer using photolithography and etching. The material of the P type electrode is nickel/chrome/gold, platinum/gold, platinum/nickel/gold, or nickel/gold-zinc. The material of the N type electrode is nickel/chrome/gold, chrome/nickel/gold, titanium/nickel/chrome/gold, or gold/nickel/titanium/silicon/titanium. The P type electrode and the N type electrode are formed by photolithography and etching after evaporation or sputtering.

The material of the patterned metal layer is chromium or tungsten, and the layer is formed on the undoped semiconductor layer by photolithography and etching after evaporation or sputtering.

The material of the above-mentioned protecting layer is $SiO_2$, $Si_3N_4$, or SiON, and the layer is formed by chemical vapor deposition (CVD) or plasma enhanced chemical vapor deposition (PECVD).

The above-mentioned inventions are explained by the following figures each showing the corresponding structure and the descriptions describing the corresponding figure.

Figure 1B:
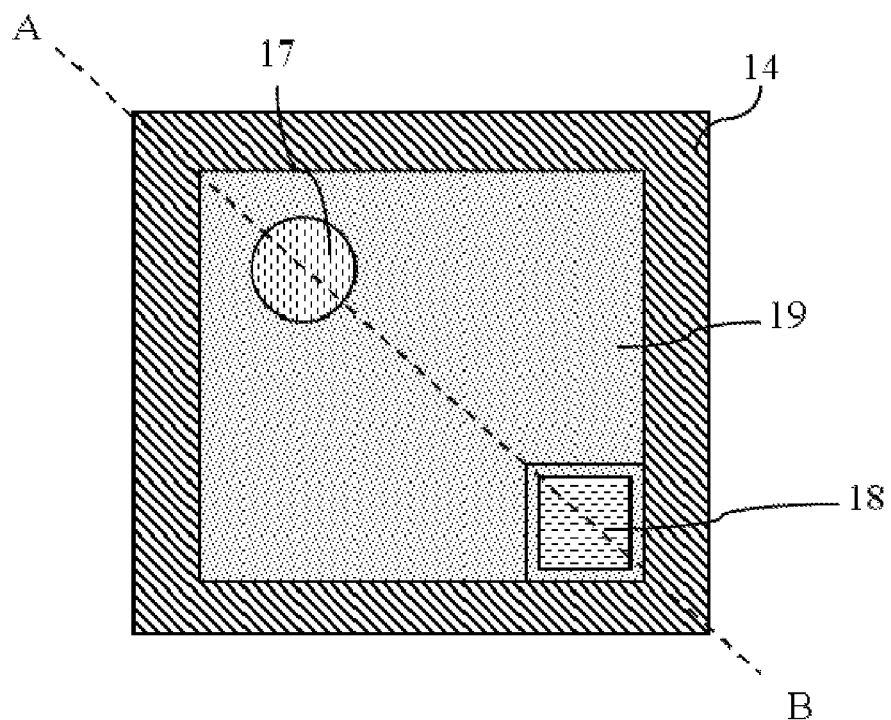
FIG. 1B is a top view of the lateral thermal dissipation LED in FIG. 1A.

FIG. 1A is a cross-sectional view of a lateral thermal dissipation LED according to an embodiment of the present invention, and FIG. 1B is a top view of the lateral thermal dissipation LED in FIG. 1A. The present invention provides a lateral thermal dissipation LED 1 comprising a substrate 10, an N type conductive semiconductor layer 11, a light emitting layer 12, a P type conductive semiconductor layer 13 and a heat spreading layer 14. A buffer layer 15 is interposed between the substrate 10 and the N type conductive semiconductor layer 11. An undoped semiconductor layer 16 is interposed between the buffer layer 15 and the N type conductive semiconductor layer 11.

The light emitting layer 12 is sandwiched between the N type conductive semiconductor layer 11 and the P type conductive semiconductor layer 13. The light emitting layer 12 is a single quantum well layer or a multiple quantum well layer.

Portions of the P type conductive semiconductor layer 13, the light emitting layer 12, and the N type conductive semiconductor layer 11 are removed as cavities so as to expose a portion of the N type conductive semiconductor layer 11 using photolithography and etching. A P type electrode 17 is formed on the P type conductive semiconductor layer 13, and an N type electrode 18 is formed on the exposed portion of the N type conductive semiconductor layer 11.

A protecting layer 19 covers the P type conductive semiconductor layer 13 and the N type conductive semiconductor layer 11, but does not cover the N type electrode 18 and the P type electrode 17. The above-mentioned heat spreading layer 14 connects the N type conductive semiconductor layer 11 with the substrate 10.

FIGS. 2A to 2I are cross-sectional views showing a method for manufacturing a lateral thermal dissipation LED according to an embodiment of the present invention. The manufacturing method comprises the following steps.

Figure 2A:
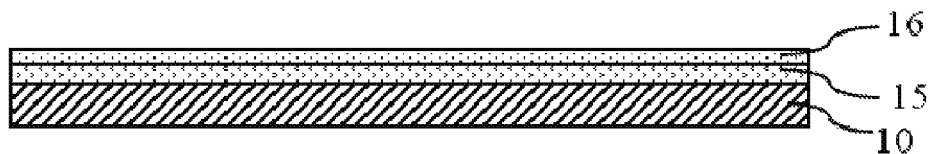
FIGS. 2A to 2I are cross-sectional views showing a method for manufacturing a lateral thermal dissipation LED according to an embodiment of the present invention.

As shown in FIG. 2A, a substrate 10 is provided. The buffer layer 15 and the undoped semiconductor layer 16 are sequentially formed on the substrate 10. The buffer layer 15 and undoped semiconductor layer 16 are formed by MOCVD.

Figure 2B:
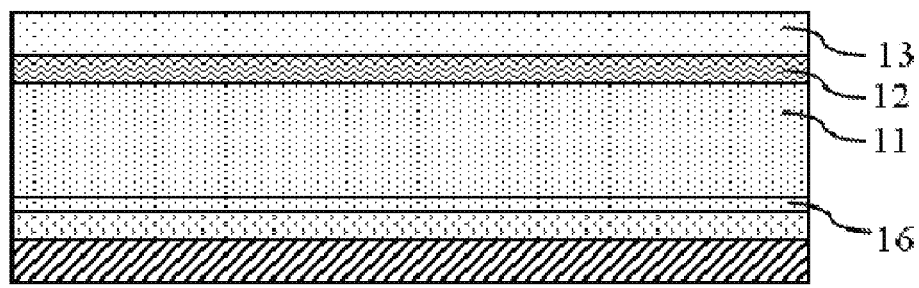

As shown in FIG. 2B, the N type conductive semiconductor layer 11, the light emitting layer 12, and the P type conductive semiconductor layer 13 are sequentially formed on the undoped semiconductor layer 16. The N type conductive semiconductor layer 11 is formed on the undoped semiconductor layer 16, the light emitting layer 12 is then formed on the N type conductive semiconductor layer 11, and the P type conductive semiconductor layer 13 is overlaid on the light emitting layer 12. The above-mentioned lateral thermal dissipation LED 1 is a Group III-V nitride LED or a Group II-VI nitride LED. The light emitting layer 12 is a single quantum well layer or a multiple quantum well layer. The N type conductive semiconductor layer 11, the light emitting layer 12, and the P type conductive semiconductor layer 13 are formed by MOCVD or molecular beam epitaxy (MBE).

Figure 2C:
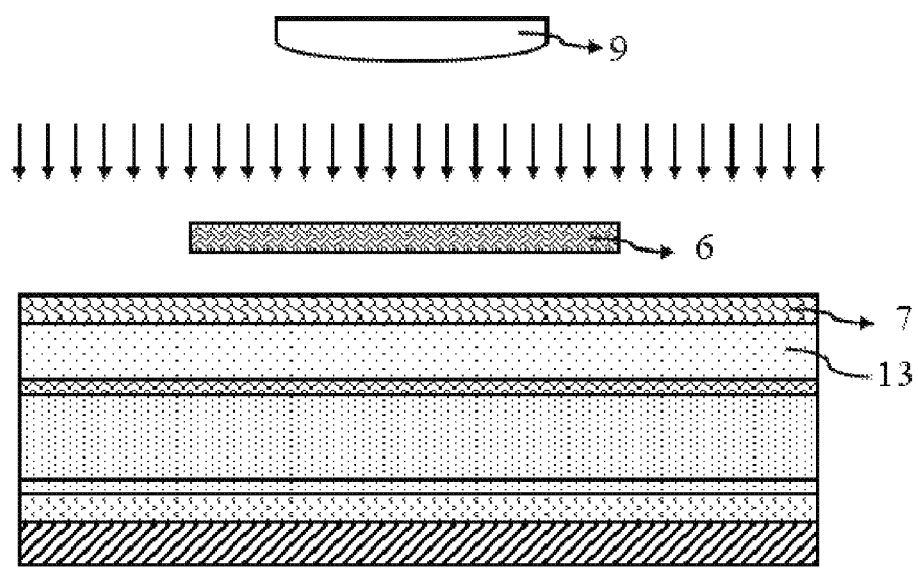

Portions of the P type conductive semiconductor layer 13, the light emitting layer 12, and the N type conductive semiconductor layer 11 are removed so as to expose a portion of the N type conductive semiconductor layer 11 using photolithography and etching. FIG. 2C shows a preferable embodiment of the present invention implementing the above-mentioned steps using photolithography and etching. As shown in FIG. 2C, a photoresist layer 7 is coated on the P type conductive semiconductor layer 13. A mask layer 6 is placed above the photoresist layer 7, and a light source 9 above the mask layer 6 emits light towards it.

Figure 2D:
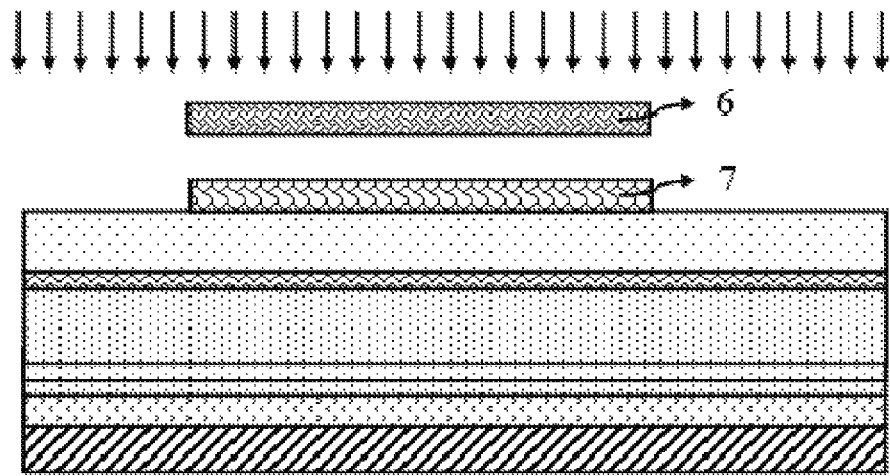

As shown in FIG. 2D, after the photoresist layer 7 is exposed to light, the exposed portions of the photoresist layer 7 are dissolved. The unexposed portions covered with the mask layer 6 are remained.

The photoresist layer 7 is positive photoresist. That is, the photoresist is softened or dissolved after exposure. In another embodiment, the photoresist layer 7 is negative photoresist, so the photoresist is not softened or dissolved after exposure. Accordingly, if the mask layer is used for negative photoresist, its configuration is opposite to the configuration of the mask layer 6 used in the step as shown in FIG. 2D, and the exposed portions not covered with the mask layer 6 remain.

Figure 2E:
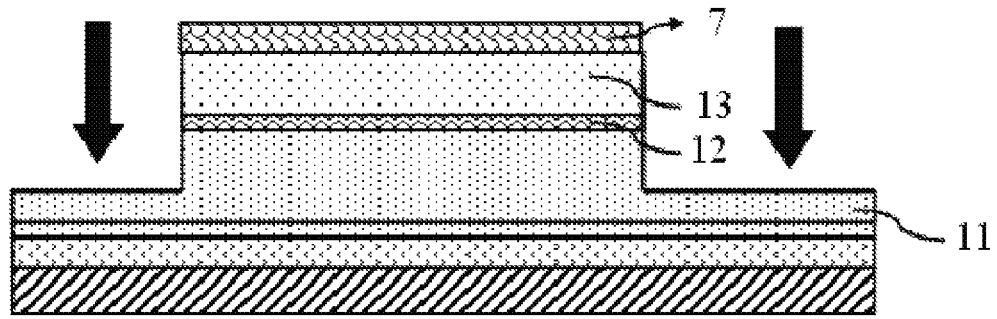

As shown in FIG. 2E, after the mask layer 6 and the light source 9 are taken away, portions of the P type conductive semiconductor layer 13, the light emitting layer 12, and the N type conductive semiconductor layer 11 are removed using etching. The etching technology includes the wet etching method and the dry etching method.

The above-mentioned wet etching method immerses a wafer in a chemical solvent or sprays the chemical solvent on the wafer. The semiconductor layer is removed because of the chemical reaction of the etchant and the etched object.

In addition, the dry etching method includes plasma etching. The etching gas is dissolved into ions, charged molecules, electrons and highly reactive electron groups by plasma, so the etched object is transformed into volatile materials. In addition, sputter etching is also included. Inert gas is biased using an external electrical field so as to bring accelerated positive electrons to sputter the etched object. The reactive ion etching (RIE) is also included in the etching method, and combines physical ion bombardment with chemical reaction for etching. It mainly utilizes the chemical reaction for etching, and further cooperates with the action of the ion bombardment to break the atomic bonds on the surface of the etched object. Simultaneously, the polymer further deposited on the surface of the etched object can also be etched out, so the etching process can continue.

Figure 2F:
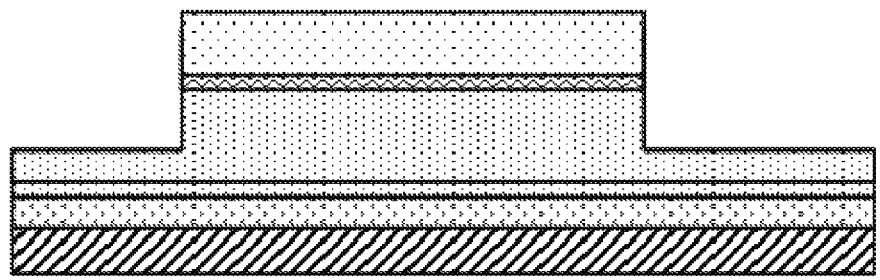

As shown in FIG. 2F, after the photoresist layer 7 is removed, a die with an epitaxial mesa is formed.

Figure 2G:
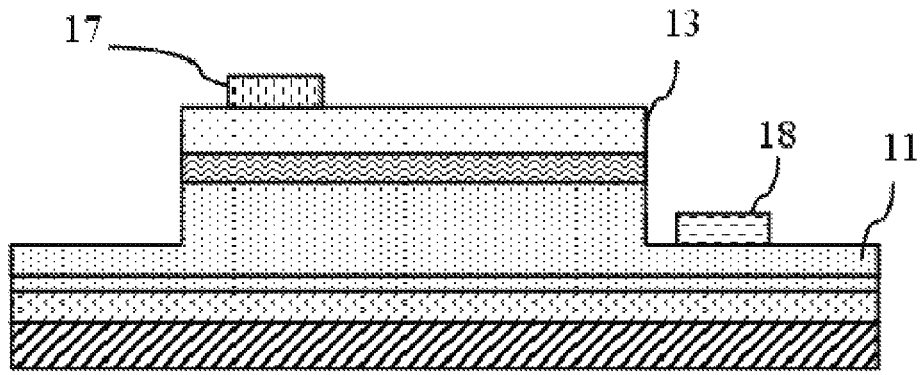

As shown in FIG. 2G, the metal layer is formed by evaporation or sputtering. Then, the P type electrode 17 is formed on the P type conductive semiconductor layer 13 by photolithography and etching, and the N type electrode 18 is formed on the exposed N type conductive semiconductor layer 11.

Figure 2H:
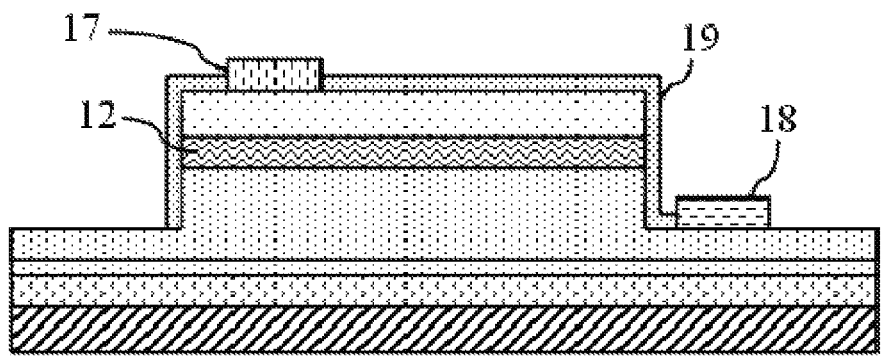

As shown in FIG. 2H, the protecting layer 19 is overlaid on the above-mentioned P type conductive semiconductor layer 13, the light emitting layer 12, and the N type conductive semiconductor layer 11 by chemical vapor deposition (CVD) or plasma enhanced chemical vapor deposition (PECVD), and the N type electrode 18 and P type electrode 17 are further exposed.

Figure 2I:
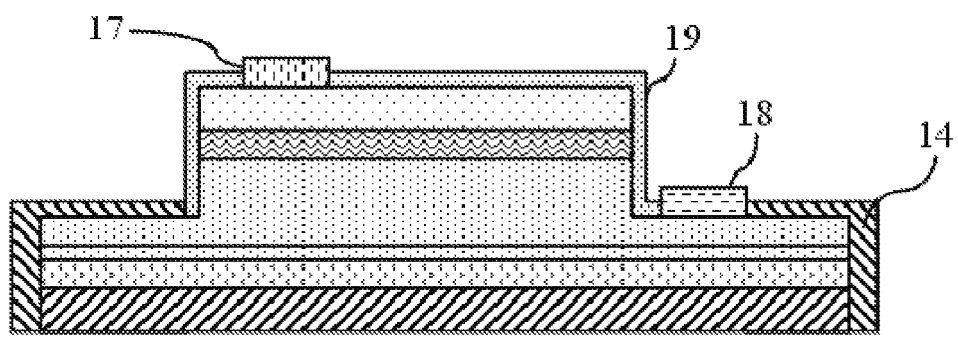

As shown in FIG. 2I, during the packaging process, thermal dissipation adhesive is coated on a packaging substrate. When the LED die is disposed on the packaging substrate covered with the thermal dissipation adhesive, the thermal dissipation adhesive can flow to the exposed surface of the N type conductive semiconductor layer 11 along the laterals of the LED. After the thermal dissipation adhesive is cooled, the heat spreading layer 14 is formed on the exposed surface of the N type conductive semiconductor layer 11 and also covers the packaging substrate.

Figure 3A:
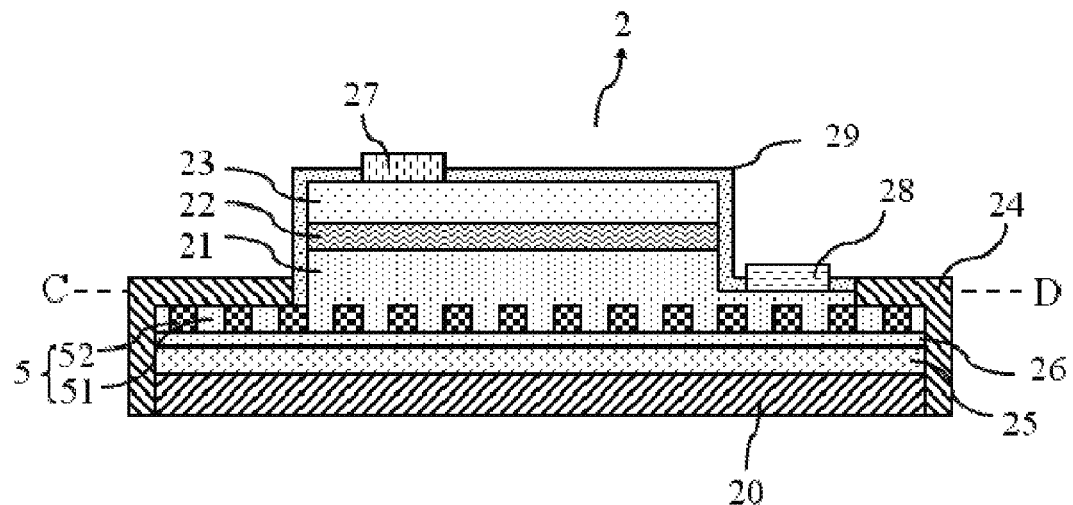
FIG. 3A is a cross-sectional diagram of a lateral thermal dissipation LED according to another embodiment of the present invention.
Figure 3B:
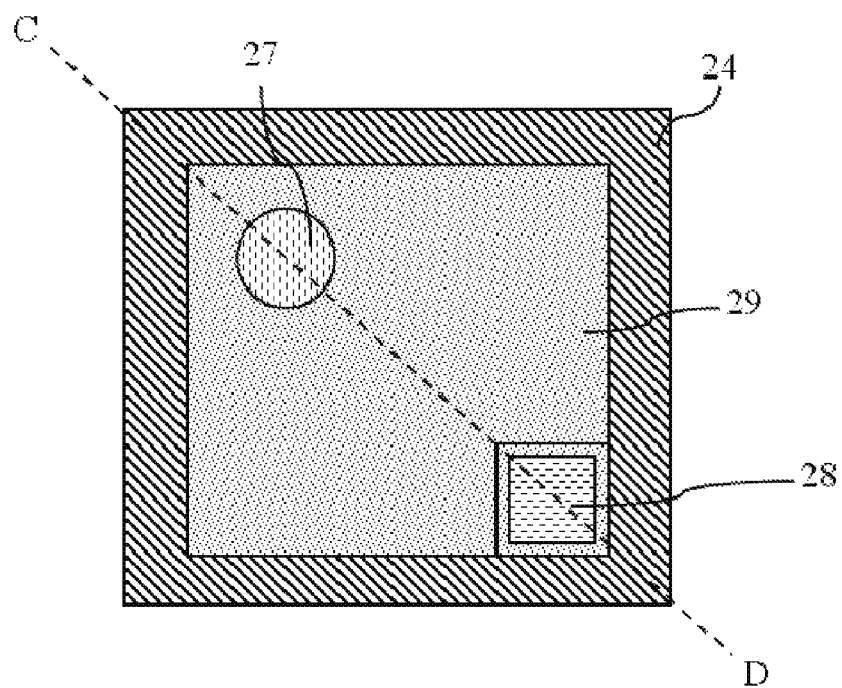
FIG. 3B is a top view of the lateral thermal dissipation LED in FIG. 3A.

FIG. 3A is a cross-sectional diagram of a lateral thermal dissipation LED according to another embodiment of the present invention. FIG. 3B is a top view of the lateral thermal dissipation LED in FIG. 3A. The present invention provides a lateral thermal dissipation LED 2 comprising a substrate 20, an N type conductive semiconductor layer 21, a light emitting layer 22, a P type conductive semiconductor layer 23, a heat spreading layer 24, and a metal layer 5 with a pattern.

A buffer layer 25 is interposed between the substrate 20 and the metal layer 5 with the pattern. An undoped semiconductor layer 26 is interposed between the buffer layer 25 and the metal layer 5 with the pattern.

The light emitting layer 22 is sandwiched between the N type conductive semiconductor layer 21 and the P type conductive semiconductor layer 23. The light emitting layer 22 is a single quantum well layer or a multiple quantum well layer.

Portions of the P type conductive semiconductor layer 23, the light emitting layer 22, the N type conductive semiconductor layer 21, and the patterned metal layer 5 are removed as cavities so as to expose portions of the N type conductive semiconductor layer 21 and the patterned metal layer 5. A P type electrode 27 is formed on the P type conductive semiconductor layer 23, and an N type electrode 28 is formed on the exposed portion of the N type conductive semiconductor layer 21.

Furthermore, a protecting layer 29 covers the P type conductive semiconductor layer 23 and the N type conductive semiconductor layer 21, but does not cover the N type electrode 28 and the P type electrode 27. The above-mentioned heat spreading layer 24 connects the N type conductive semiconductor layer 21 with the substrate 20.

FIGS. 4A to 4J are cross-sectional views showing a method for manufacturing a lateral thermal dissipation LED according to the lateral thermal dissipation LED of the present invention. The manufacturing method comprises the following steps.

Figure 4A:
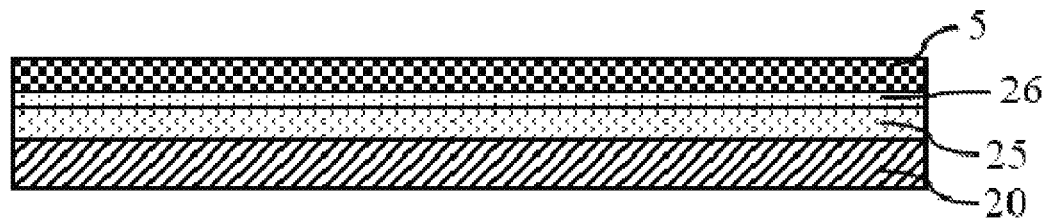
FIGS. 4A to 4J are cross-sectional views showing a method for manufacturing a lateral thermal dissipation LED according to another embodiment of the present invention.

As shown in FIG. 4A, a substrate 20 is provided. The buffer layer 25, the undoped semiconductor layer 26 and a metal layer 5 are sequentially formed on the substrate 20. The above-mentioned buffer layer 25 and undoped semiconductor layer 26 are formed by MOCVD. The metal layer 5 is formed on the undoped semiconductor layer 26 by evaporation or sputter.

Figure 4B:
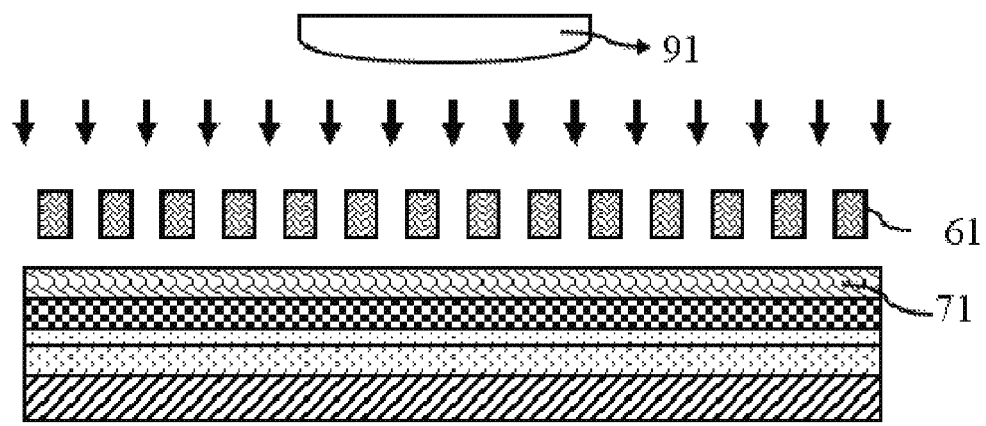

Thereafter, the metal layer 5 is patterned using photolithography and etching. A preferable embodiment of the present invention utilizes photolithography and etching to perform the above-mentioned steps. As shown in FIG. 4B, a photoresist layer 71 is coated on the metal layer 5. A mask layer 61 is placed above the photoresist layer 71, and a light source 91 above the mask layer 61 emits light towards it.

Figure 4C:
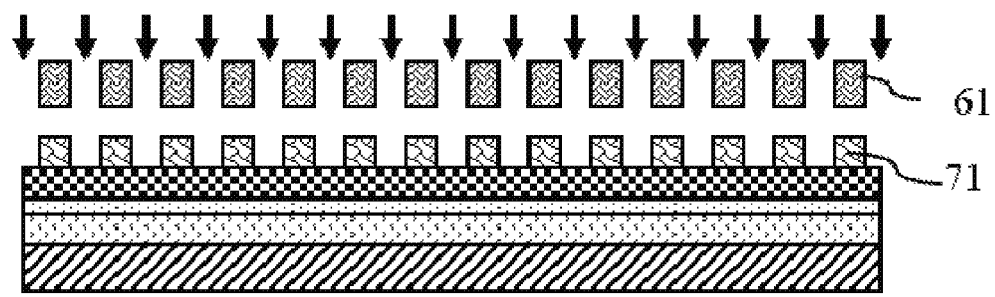

As shown in FIG. 4C, after the photoresist layer 71 is exposed to light, the exposed portions of the photoresist layer 71 are dissolved. The unexposed portions covered with the mask layer 61 are remained.

The photoresist layer 71 is positive photoresist. That is, the photoresist is softened or dissolved after exposure. In another embodiment, the photoresist layer 71 is negative photoresist, so the photoresist is not softened or dissolved after exposure. Accordingly, if the mask layer is used for negative photoresist, its configuration is opposite to the configuration of the mask layer 61 used in the step as shown in FIG. 4C, and the exposed portions not covered with the mask layer 61 remain.

Figure 4D:
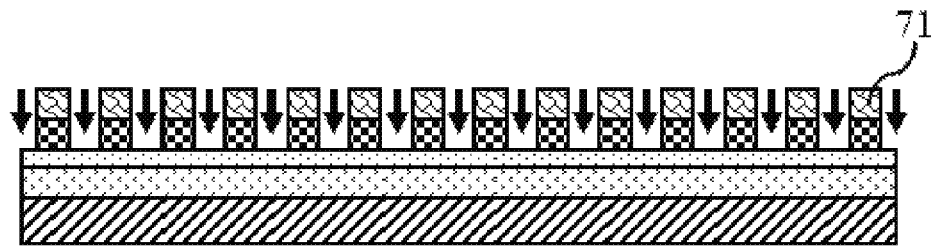

As shown in FIG. 4D, after the mask layer 61 and the light source 91 are taken away, portions of the metal layer 5 are removed using etching to form a plurality of holes 51. The etching technology includes the wet etching method or the dry etching method.

Figure 4E:
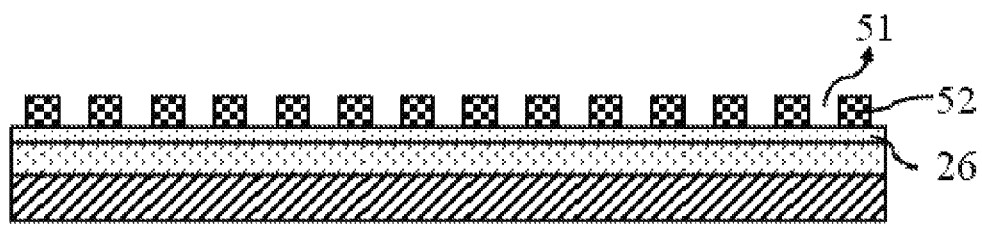

As shown in FIG. 4E, after the photoresist layer 71 is removed, the metal layer 5 with a pattern is formed on the undoped semiconductor layer 26. The metal layer 5 with a pattern comprises the holes 51 and the patterned metal 52.

Figure 4F:
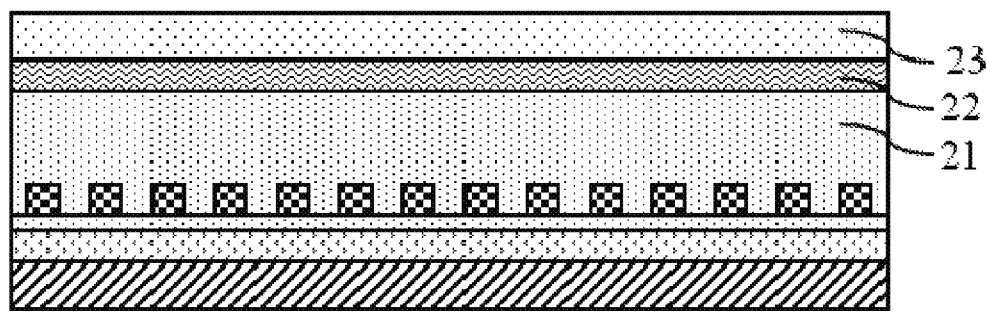

As shown in FIG. 4F, the N type conductive semiconductor layer 21, the light emitting layer 22, and the P type conductive semiconductor layer 23 are sequentially formed on the metal layer 5. The metal layer 5 with the pattern and the N type conductive semiconductor layer 21 have ohmic contact resistance. The N type conductive semiconductor layer 21 is further filled in the holes 51 of the metal layer 5 with the pattern. The above-mentioned lateral thermal dissipation LED 2 is a Group III-V nitride LED or a Group II-VI nitride LED. The light emitting layer 22 is a single quantum well layer or a multiple quantum well layer. The N type conductive semiconductor layer 21, the light emitting layer 22, and the P type conductive semiconductor layer 23 are formed by MOCVD or molecular beam epitaxy (MBE).

Figure 4G:
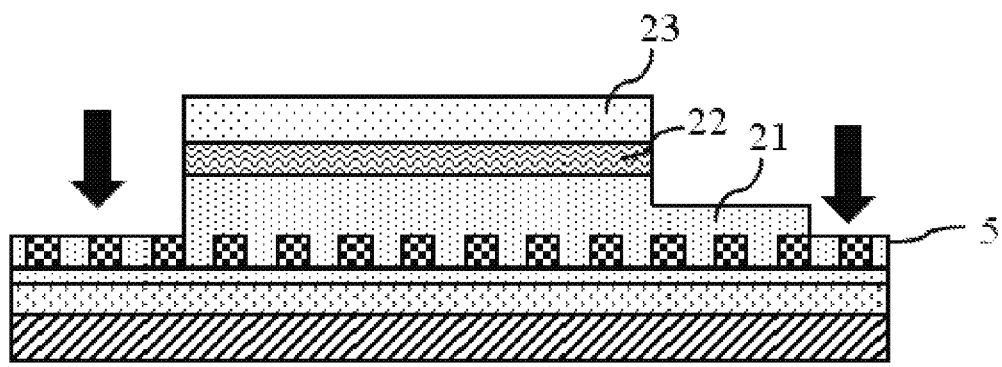

As shown in FIG. 4G, portions of the P type conductive semiconductor layer 23, the light emitting layer 22, and the N type conductive semiconductor layer 21 are removed so as to expose a portion of the N type conductive semiconductor layer 21 and the metal layer 5 with the pattern using photolithography and etching.

Figure 4H:
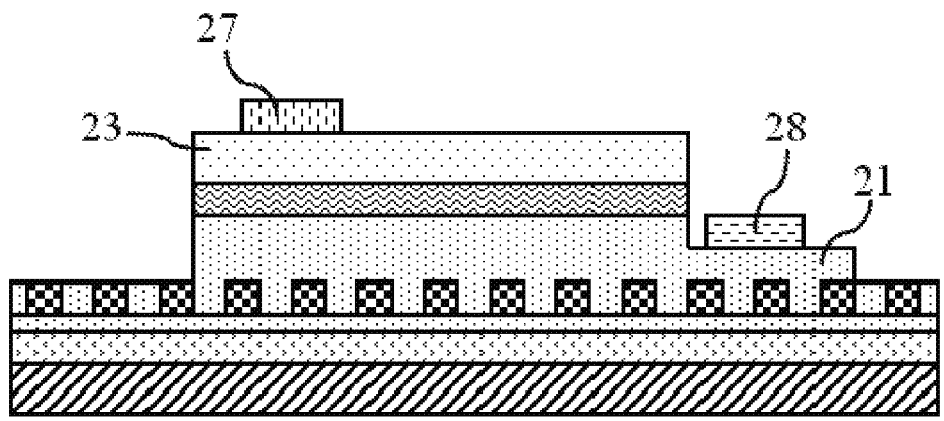

As shown in FIG. 4H, the P type electrode 27 is formed on the P type conductive semiconductor layer 23 by photolithography and etching, and the N type electrode 28 is formed on the exposed N type conductive semiconductor layer 21.

Figure 4I:
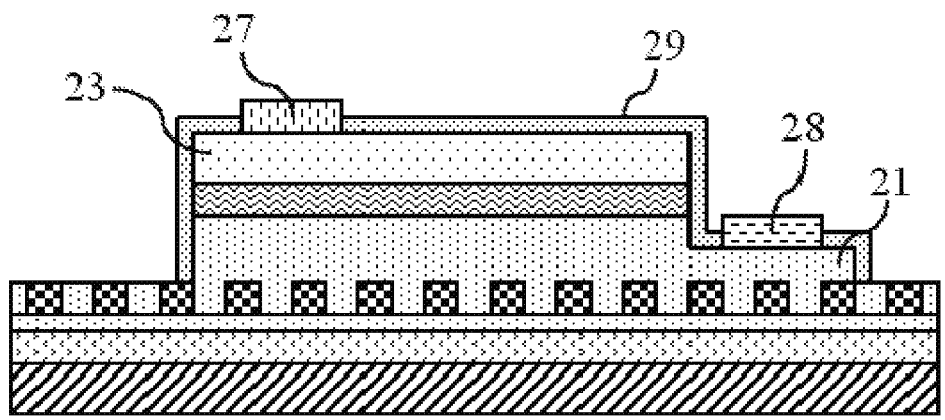

As shown in FIG. 4I, the protecting layer 29 is overlaid on the above-mentioned P type conductive semiconductor layer 23, the light emitting layer 22, and the N type conductive semiconductor layer 21 by chemical vapor deposition (CVD) or plasma enhanced chemical vapor deposition (PECVD), and the N type electrode 28 and P type electrode 27 are further exposed.

Figure 4J:
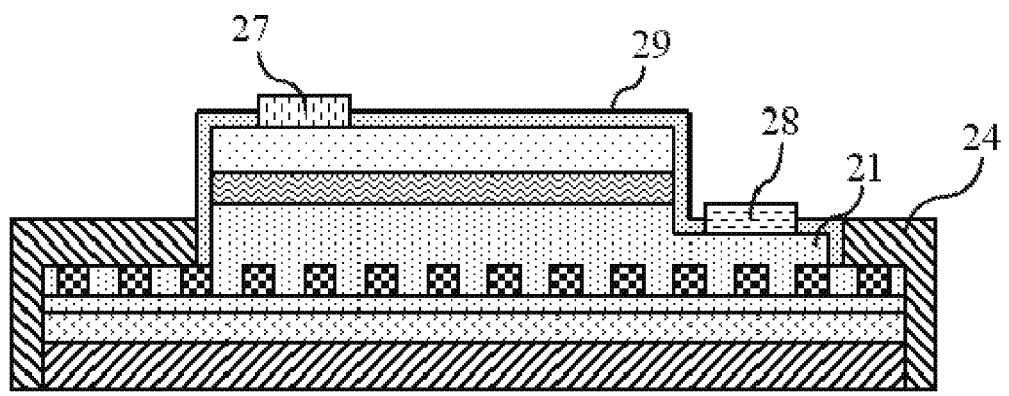

As shown in FIG. 4J, during the packaging process, thermal dissipation adhesive is coated on a packaging substrate. When the LED die is disposed on the packaging substrate covered with the thermal dissipation adhesive, the thermal dissipation adhesive can flow to the exposed surface of the N type conductive semiconductor layer 21 along the laterals of the LED. After the thermal dissipation adhesive is cooled down, the heat spreading layer 24 is formed on the exposed surface of the N type conductive semiconductor layer 21 and also covers the substrate 20.

Figure 5A:
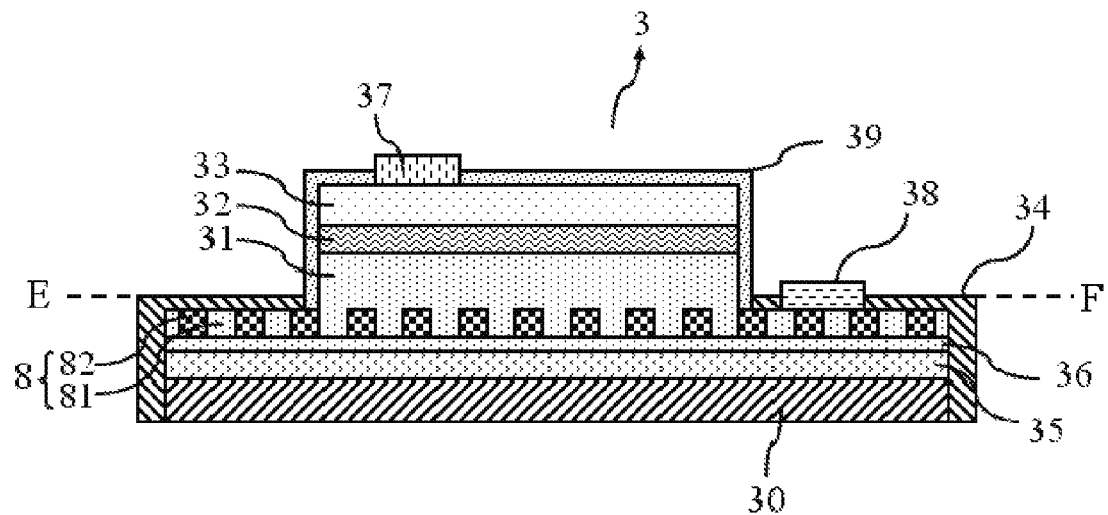
FIG. 5A is a cross-sectional diagram of a lateral thermal dissipation LED according to another embodiment of the present invention.
Figure 5B:
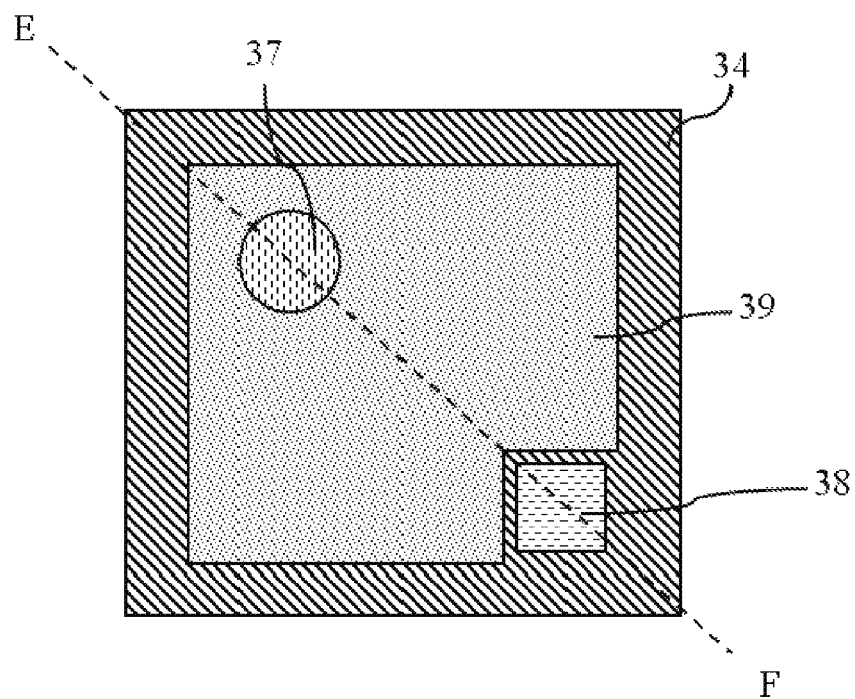
FIG. 5B is a top view of the lateral thermal dissipation LED in FIG. 5A.

FIG. 5A is a cross-sectional diagram of a lateral thermal dissipation LED according to another embodiment of the present invention. FIG. 5B is a top view of the lateral thermal dissipation LED in FIG. 5A. The present invention provides a lateral thermal dissipation LED 3 comprising a substrate 30, an N type conductive semiconductor layer 31, a light emitting layer 32, a P type conductive semiconductor layer 33, a heat spreading layer 34, and a metal layer 8 with a pattern.

A buffer layer 35 is interposed between the substrate 30 and the patterned metal layer 8. An undoped semiconductor layer 36 is interposed between the buffer layer 35 and the patterned metal layer 8.

The light emitting layer 32 is sandwiched between the N type conductive semiconductor layer 31 and the P type conductive semiconductor layer 33. The light emitting layer 32 is a single quantum well layer or a multiple quantum well layer.

Portions of the P type conductive semiconductor layer 33, the light emitting layer 32, the N type conductive semiconductor layer 31, and the patterned metal layer 8 are removed as cavities so as to expose portions of the patterned metal layer 8. A P type electrode 37 is formed on the P type conductive semiconductor layer 33, and an N type electrode 38 is formed on the exposed portion of the patterned metal layer 8.

Furthermore, a protecting layer 39 covers the P type conductive semiconductor layer 33 and the N type conductive semiconductor layer 31, but does not cover the N type electrode 38 and the P type electrode 37. The above-mentioned heat spreading layer 34 connects the patterned metal layer 8 with the substrate 30.

In this embodiment of the lateral thermal dissipation LED 3, the N electrode 38 is disposed on the patterned metal layer 8. Because the patterned metal layer 8 is a conductively metallic layer, it can further equalize the current density of the light emitting layer 32. Accordingly, the lighting efficiency of the lateral thermal dissipation LED 3 is significantly improved.

FIGS. 6A to 6J are cross-sectional views showing a method for manufacturing a lateral thermal dissipation LED according to another embodiment of the present invention. The manufacturing method comprises the following steps.

Figure 6A:
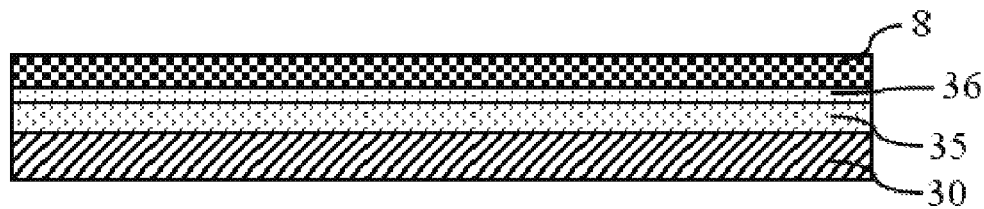
FIGS. 6A to 6J are cross-sectional views showing a method for manufacturing a lateral thermal dissipation LED according to another embodiment of the present invention.

As shown in FIG. 6A, a substrate 30 is provided. The buffer layer 35, the undoped semiconductor layer 36 and a metal layer 8 are sequentially formed on the substrate 30. The buffer layer 35 and undoped semiconductor layer 36 are formed by MOCVD. The metal layer 8 is formed on the undoped semiconductor layer 36 by evaporation or sputter.

Figure 6B:
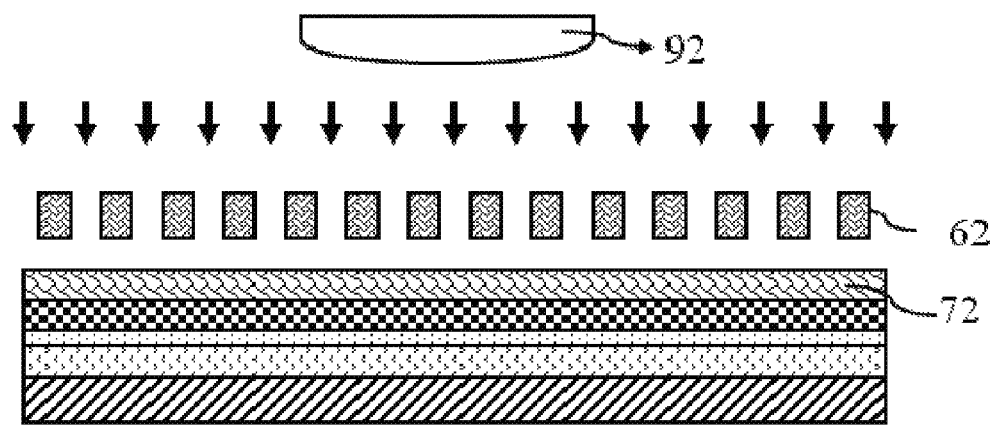

Thereafter, the metal layer 8 is patterned using photolithography and etching. A preferable embodiment of the present invention utilizes photolithography and etching to perform the above-mentioned steps. As shown in FIG. 6B, a photoresist layer 72 is coated on the metal layer 8. A mask layer 62 is placed above the photoresist layer 72, and a light source 92 above the mask layer 62 emits light towards it.

Figure 6C:
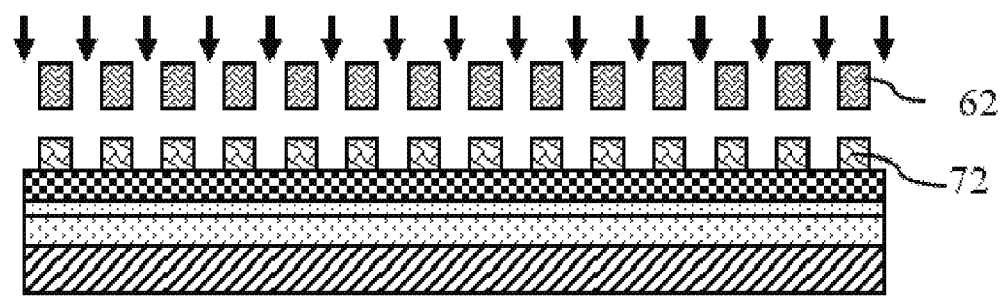

As shown in FIG. 6C, after the photoresist layer 72 is exposed to light, the exposed portions of the photoresist layer 72 are dissolved. By contrast, the unexposed portions covered with the mask layer 62 are remained.

The photoresist layer 72 is positive photoresist. That is, the photoresist is softened or dissolved after exposure. In another embodiment, the photoresist layer 72 is negative photoresist, so the photoresist is not softened or dissolved after exposure. Accordingly, if the configuration of the mask layer is used for negative photoresist, its configuration is opposite to the configuration of the mask layer 62 used in the step as shown in FIG. 6C, and the exposed portions not covered with the mask layer 62 are remained.

Figure 6D:
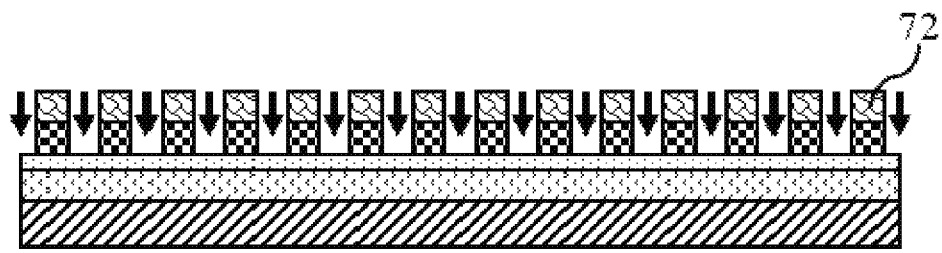

As shown in FIG. 6D, after the mask layer 62 and the light source 92 are taken away, portions of the metal layer 8 are removed using etching to form a plurality of holes 81. The etching technology includes the wet etching method or the dry etching method.

Figure 6E:
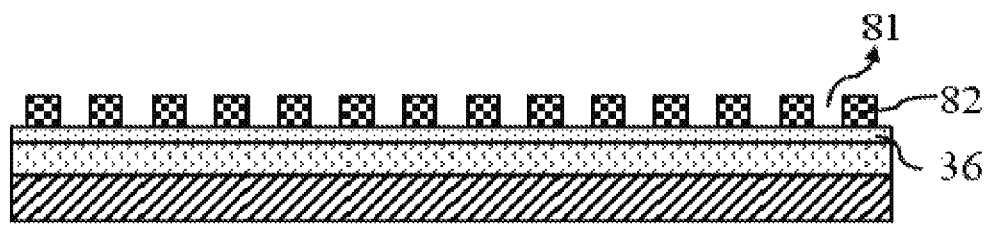

As shown in FIG. 6E, after the photoresist layer 72 is removed, the metal layer 8 with a pattern is formed on the undoped semiconductor layer 36. The metal layer 8 with a pattern comprises the holes 81 and the patterned metal 82.

Figure 6F:
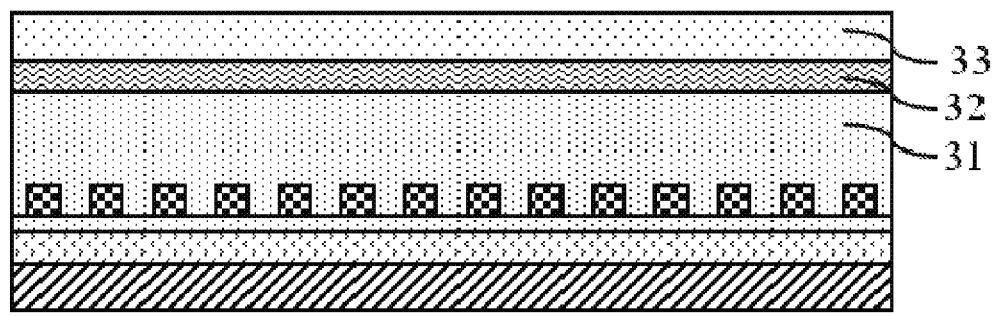

As shown in FIG. 6F, the N type conductive semiconductor layer 31, the light emitting layer 32, and the P type conductive semiconductor layer 33 are sequentially formed on the metal layer 8. The metal layer 8 with the pattern and the N type conductive semiconductor layer 31 have ohmic contact resistance. The N type conductive semiconductor layer 31 is further filled in the holes 81 of the metal layer 8 with the pattern. The above-mentioned lateral thermal dissipation LED 3 is a Group III-V nitride LED or a Group II-VI nitride LED. The light emitting layer 32 is a single quantum well layer or a multiple quantum well layer. The N type conductive semiconductor layer 31, the light emitting layer 32, and the P type conductor semiconductor layer 33 are formed by MOCVD or molecular beam epitaxy (MBE).

Figure 6G:
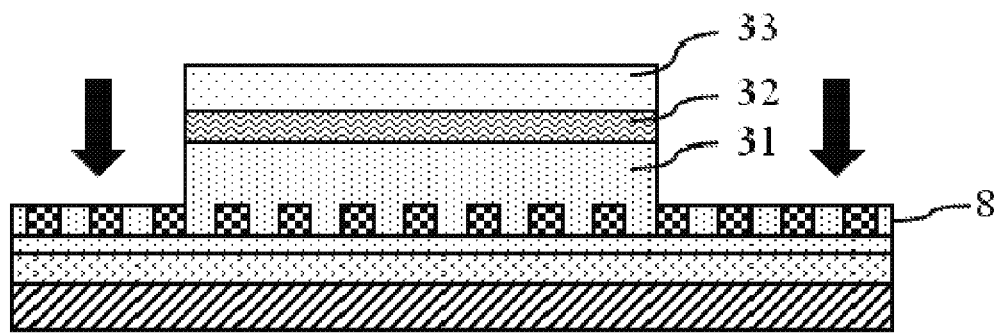

As shown in FIG. 6G, portions of the P type conductive semiconductor layer 33, the light emitting layer 32, and the N type conductive semiconductor layer 31 are removed so as to expose a portion of the N type conductive semiconductor layer 31 and the metal layer 8 with the pattern using photolithography and etching.

Figure 6H:
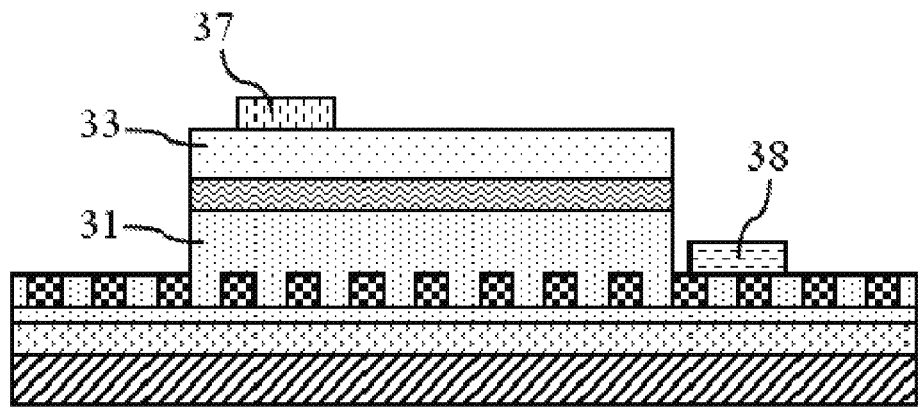

As shown in FIG. 6H, the P type electrode 37 is formed on the P type conductive semiconductor layer 33 by photolithography and etching, and the N type electrode 38 is formed on the exposed portions of the metal layer 8.

Figure 6I:
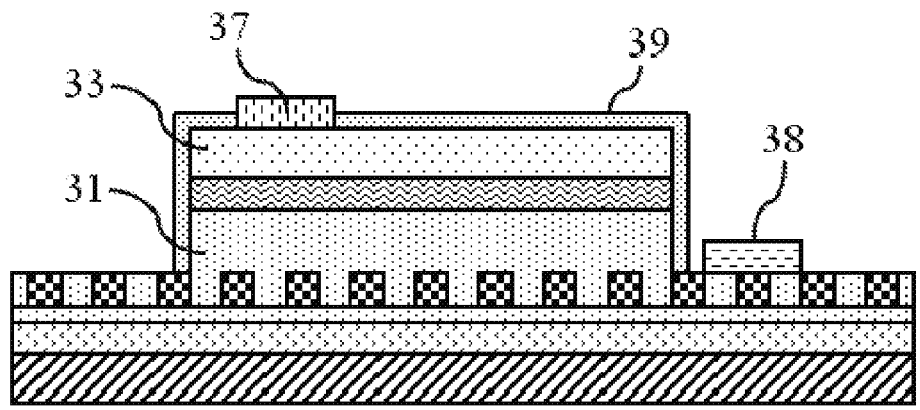

As shown in FIG. 6I, the protecting layer 39 is overlaid on the above-mentioned P type conductive semiconductor layer 33, the light emitting layer 32, and the N type conductive semiconductor layer 31 by chemical vapor deposition (CVD) or plasma enhanced chemical vapor deposition (PECVD), and the N type electrode 38 and P type electrode 37 are further exposed.

Figure 6J:
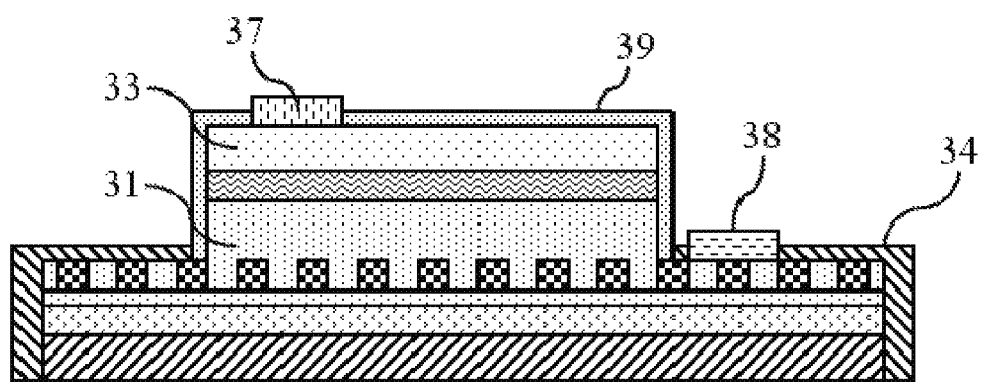

As shown in FIG. 6J, during the packaging process, thermal dissipation adhesive is coated on a packaging substrate. When the LED die is disposed on the packaging substrate covered with the thermal dissipation adhesive, the thermal dissipation adhesive can flow to the exposed surface of the N type conductive semiconductor layer 31 along the laterals of the LED. After the thermal dissipation adhesive is cooled down, the heat spreading layer 34 is formed on the exposed portions of the metal layer 8 and also covers the substrate 30.

The above-mentioned substrate of the lateral thermal dissipation LED can be a sapphire ($Al_2O_3$) substrate, a silicon carbide (SiC) substrate, a lithium aluminate ($LiAlO_2$) substrate, a lithium gallates ($LiGaO_2$) substrate, a silicon substrate, a gallium nitride (GaN) substrate, a zinc oxide (ZnO) substrate, an aluminum zinc oxide (AlZnO) substrate, a gallium arsenide (GaAs) substrate, a gallium phosphide (GaP) substrate, a gallium antimonide (GaSb) substrate, an indium phosphide (InP) substrate, an indium arsenide (InAs) substrate, or a zinc selenide (ZnSe) substrate.

The above-mentioned lateral thermal dissipation LED is a Group III-V nitride LED or a Group II-VI nitride LED. The light emitting layer is a single quantum well layer or a multiple quantum well layer. The N type conductive semiconductor layer, the light emitting layer, and the P type conductive semiconductor layer are formed by metal organic chemical vapor deposition (MOCVD).

The above-mentioned heat spreading layer is formed using cooled and solidified thermal dissipation adhesive, and is made by mixing silver and epoxy.

The material of the above-mentioned buffer is aluminum nitride (AlN), aluminum gallium nitride (AlGaN), or arsenic gallium nitride/indium gallium nitride (AsGaN/InGaN). The material of the above-mentioned undoped semiconductor layer is gallium nitride (GaN). The above-mentioned buffer layer and undoped semiconductor layer are formed by MOCVD.

The material of the above-mentioned P type electrode and N type electrode is a metal with high conductivity. Copper is a preferable material for the present embodiments. The material of the patterned metal layer is a heat-proof and highly conductive metal such as chromium or tungsten.

The material of the above-mentioned protecting layer is $SiO_2$, $Si_3N_4$, or SiON.

Figure 7:
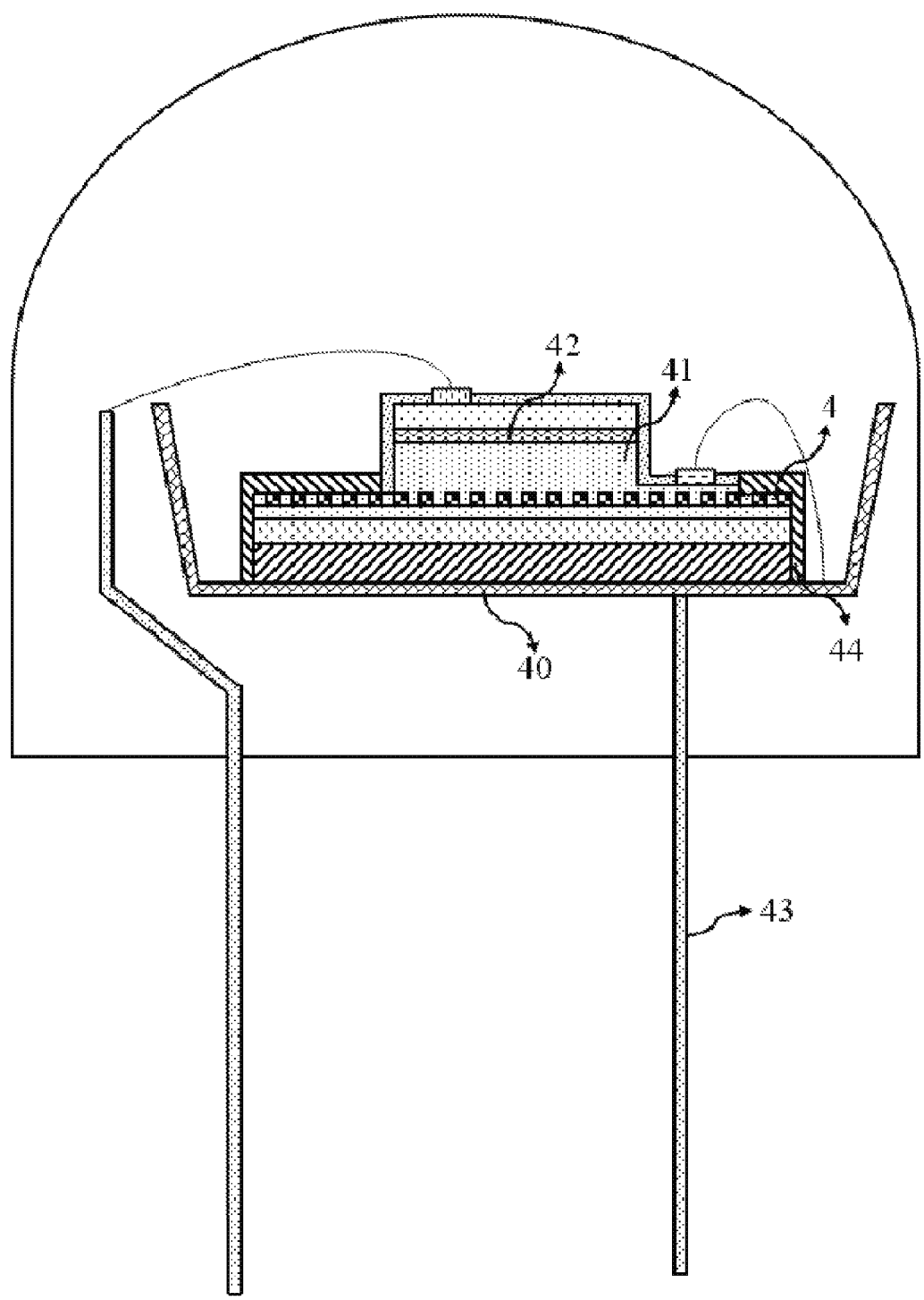
FIG. 7 is a cross-sectional view showing a package structure of a lateral thermal dissipation LED according to an embodiment of the present invention.

FIG. 7 is a cross-sectional view showing a package structure of a lateral thermal dissipation LED according to an embodiment of the present invention. When the lateral thermal dissipation LED emits light, heat generating from a light emitting layer 42 is transferred to a heat spreading layer 44 through an N type conductive semiconductor layer 41 and a metal layer 4 with a pattern. The heat spreading layer 44 can take the heat from the LED package away to the package substrate 40. Furthermore, both of the package substrate 40 and pin leads 43 conduct heat towards the exterior of the LED package.

The present invention discloses a lateral thermal dissipation LED in which the heat generated from the light emitting layer is transferred through the lateral to the outside by the metal layer with the pattern along with the packaging structure. Such an invention can solve the problem of the conventional LED with electrodes at the same side where heat is dissipated through the epitaxial substrate with a low thermal conductivity.

The LED of the present invention can improve the heat dissipation of the LED without increasing the manufacturing costs. Accordingly, the lighting efficiency of the LED is improved.

The above-described embodiments of the present invention are intended to be illustrative only. Numerous alternative embodiments may be devised by persons skilled in the art without departing from the scope of the following claims.

What is claimed is:

1. A lateral thermal dissipation LED, comprising:
a substrate;
an N type conductive semiconductor layer disposed on the substrate;
a light emitting layer disposed on the N type conductive semiconductor layer;
a P type conductive semiconductor layer disposed on the light emitting layer;
a heat spreading layer connecting the N type conductive semiconductor layer to a package substrate, the heat spreading layer being made by mixing silver and epoxy;
a buffer layer interposed between the substrate and the N type conductive semiconductor layer;
an undoped semiconductor layer interposed between the buffer layer and the N type conductive semiconductor layer; and
a metal layer with a pattern disposed on the undoped semiconductor layer,
wherein the pattern of the metal layer includes a plurality of holes, and the metal layer with the pattern and the N type conductive semiconductor layer have ohmic contact resistance;
wherein portions of the P type conductive semiconductor layer, the light emitting layer and the N type conductive semiconductor layer are removed to expose portions of the N type conductive semiconductor layer and the metal layer, and the heat spreading layer covers the exposed portions of the N type conductive semiconductor layer and the metal layer, wherein the n-type conductive semiconductor layer is formed within the plurality of holes, and wherein the heat spreading layer partially covers two side surfaces of the metal layer and a top surface of the metal layer which is orthogonal to the side surfaces of the metal layer.

2. The lateral thermal dissipation LED of claim 1, wherein the light emitting layer is a single quantum well layer or a multiple quantum well layer.

3. The lateral thermal dissipation LED of claim 1, further comprising a P type electrode and an N type electrode, wherein the P electrode is disposed on the P type conductive semiconductor layer, and the N type electrode is disposed on the exposed portion of the N type conductive semiconductor layer.

4. The lateral thermal dissipation LED of claim 3, further comprising a protecting layer covering the N type conductive semiconductor layer and the P type conductive semiconductor layer, wherein the N type electrode and the P type electrode are not covered with the protecting layer.

5. A method for manufacturing a lateral thermal dissipation LED, comprising steps of:
providing a substrate;
forming a buffer layer on the substrate;
forming an undoped semiconductor layer on the buffer layer;
forming a metal layer with a pattern on the undoped semiconductor layer, wherein the pattern of the metal layer includes a plurality of holes, and the material of the metal layer is chromium or tungsten;
forming an N type conductive semiconductor layer on the metal layer;
forming a light emitting layer on the N type conductive semiconductor layer;
forming a P type conductive semiconductor layer on the light emitting layer; and
forming a heat spreading layer on the N type conductive semiconductor layer, the heat spreading layer being made by mixing silver and epoxy;
wherein portions of the P type conductive semiconductor layer, the light emitting layer and the N type conductive semiconductor layer are removed by photolithography and etching to expose portions of the N type conductive semiconductor layer and the metal layer, and the heat spreading layer covers the exposed portions of the N type conductive semiconductor layer and the metal layer, wherein the n-type conductive semiconductor layer is formed within the plurality of holes, and wherein the heat spreading layer partially covers two side surfaces of the metal layer and a top surface of the metal layer which is orthogonal to the side surfaces of the metal layer.

6. The method of claim 5, wherein the lateral thermal dissipation LED is a Group III-V nitride LED or a Group II-VI nitride LED, and the light emitting layer is a single quantum well layer or a multiple quantum well layer.

7. The method of claim 5, wherein the pattern of the metal layer is formed on the undoped semiconductor layer by photolithography and etching after evaporation or sputtering.

8. The method of claim 5, further comprising a P type electrode and an N type electrode, wherein the P electrode is disposed on the P type conductive semiconductor layer, and the N type electrode is disposed on the exposed portion of the N type conductive semiconductor layer.

9. The method of claim 8, further comprising a step of forming a protecting layer on the N type conductive semiconductor layer and the P type conductive semiconductor layer, wherein the N type electrode and the P type electrode are not covered with the protecting layer, the material of the protecting layer is $SiO_2$, $Si_3N_4$, or SiON, and the protecting layer is formed by chemical vapor deposition (CVD) or plasma enhanced chemical vapor deposition (PECVD).

* * * * *